US006617880B2

(12) United States Patent
Yuan

(10) Patent No.: US 6,617,880 B2
(45) Date of Patent: *Sep. 9, 2003

(54) METHOD AND APPARATUS FOR A LOW POWER, MULTI-MODE GTL I/O BUFFER UTILIZING MIDRAIL I/O BUFFER PAD CLAMPING

(75) Inventor: Xiaolin Yuan, Davis, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/747,612

(22) Filed: Dec. 20, 2000

(65) Prior Publication Data

US 2002/0101265 A1 Aug. 1, 2002

(51) Int. Cl.[7] .................. H03K 19/0175; H03K 19/003
(52) U.S. Cl. .......................................... 326/83; 326/31
(58) Field of Search ................ 326/83, 86–87, 326/82, 26–28, 31, 33–34

(56) References Cited

U.S. PATENT DOCUMENTS

| 5,534,811 A | * | 7/1996 | Gist et al. .................... 327/309 |
| 5,576,635 A | * | 11/1996 | Partovi et al. ................ 326/27 |
| 6,288,962 B1 | * | 9/2001 | Nagaoka ..................... 365/210 |
| 2002/0078389 A1 | * | 6/2002 | Yuan ........................... 713/300 |

* cited by examiner

Primary Examiner—James Cho
(74) Attorney, Agent, or Firm—Blakely, Sokoloff, Taylor & Zafman LLP

(57) ABSTRACT

A method and apparatus for a multi-level GTL interface signaling buffer utilizing midrail buffer pad clamping are described. The system includes a buffer having a P-kicker pull-up device which pulls up a pad voltage level to an intended overshoot level. A pull-down device pulls down the pad voltage level to a termination voltage level VTT. Consequently, the P-kicker pull-up device and the pull-down device counteract one another to generate a low-voltage midrail overshoot level that is less than or equal to a maximum gate voltage level. The midrail overshoot level that is less than or equal to the maximum gate voltage level in order to prevent gate oxide breakdown to CPU LVGTL input buffer circuits caused by overshoot levels in excess of a maximum gauge voltage level.

30 Claims, 7 Drawing Sheets

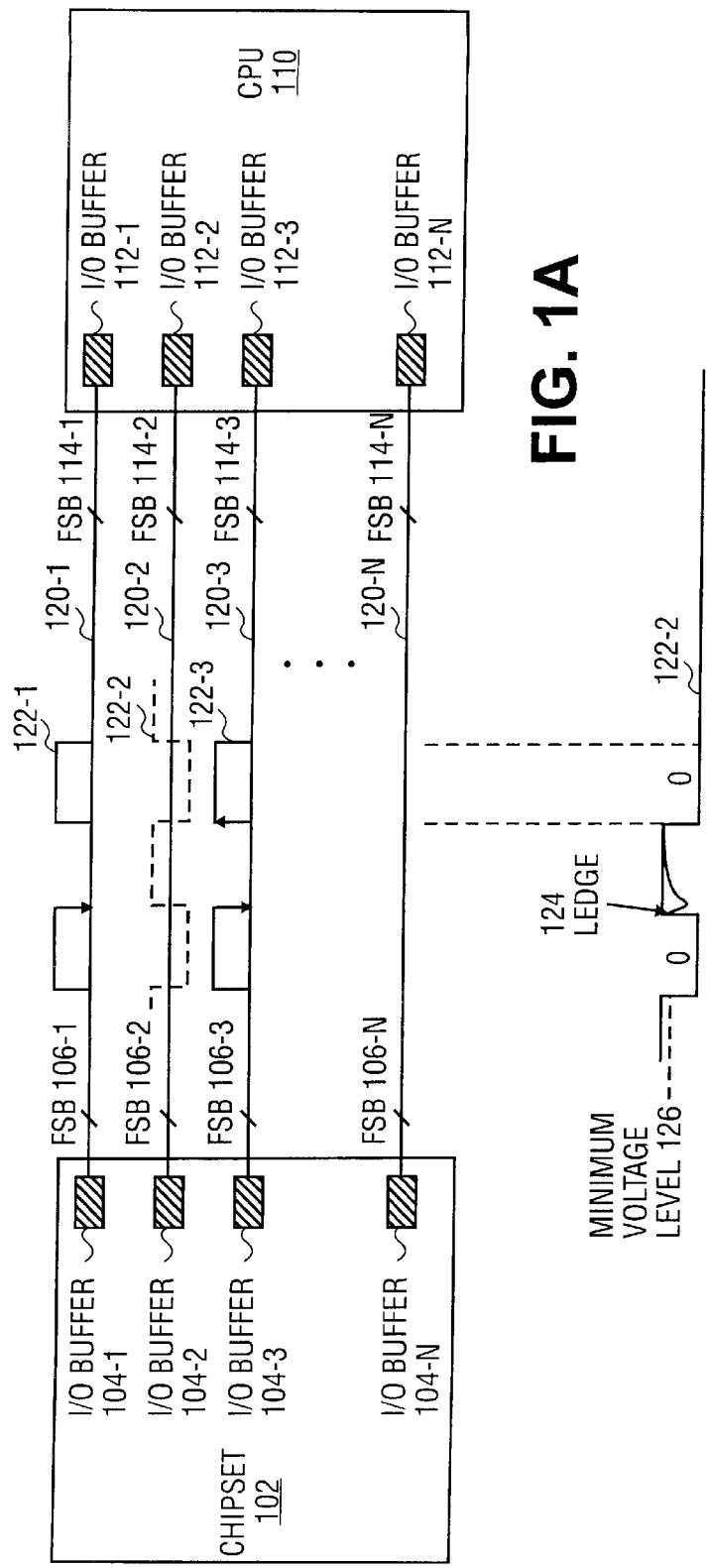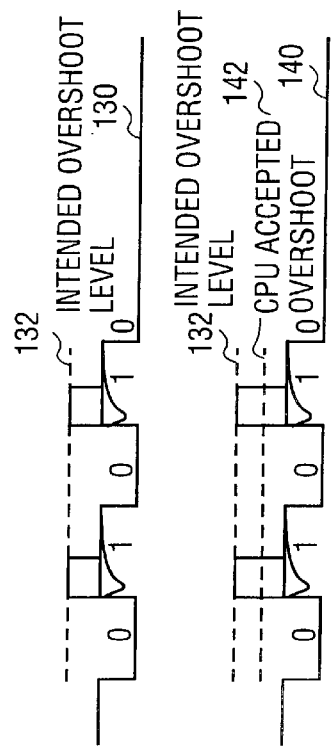

METHOD AND APPARATUS FOR A LOW POWER, MULTI-MODE GTL I/O BUFFER UTILIZING MIDRAIL I/O BUFFER PAD CLAMPING

FIELD OF THE INVENTION

The present invention relates generally to I/O (input/output) signal to signal coupling resulting from simultaneous switching output (SSO) switching. In particular, the present invention relates to an a method and apparatus for a low power, multi-mode GTL interface signaling buffer utilizing midrail buffer pad clamping.

BACKGROUND OF THE INVENTION

FIG. 1A depicts a block diagram of a computer system 100 including a chipset 102 having a plurality of front side buses (FSB) buffers 104 (104-1, 104-2, . . . , 104-N) each attached to a corresponding chipset FSB 106 (106-1, 106-2, . . . , 106-N). The computer system 100 further includes a CPU 110 including a plurality of FSB buffers 112 (112-1, 112-2, . . . , 112-N), each attached to a corresponding CPU FSB 114 (114-1, 114-2, . . . , 114-N). Each respective chipset FSB 106 communicates with a corresponding CPU FSB 114 via a trace/lane 120 (120-1, 120-2, . . . , 120-N). Unfortunately, due to the growing demand for more compact, high speed circuits, VLSI (very light scale integration) designers are forced to continuously reduce the circuit area. As a result, trace lengths and distances are continuously decreasing in comparison to one another that data on these traces begin cross-coupling to each other.

For example, in the computer system 100, the chipset 102 maybe performing simultaneous switching output (SSO), in which all buffers 104 switch simultaneously. As a result, I/O signal to signal cross-couplings between the individual traces 120 can result. Referring again to FIG. 1A, lane 120-2 may contain a pulse 122-2 that is moving in opposite direction as compared to pulse 122-1 in lane 120-1, and pulse 122-3 in lane 120-3. As a result of cross-coupling between the lanes 120, as depicted in FIG. 1A, the pulse signal 122-2 may fail to rise to a minimum voltage level 126 as depicted in FIG. 1B. Due to the failure of the pulse 122-2 to rise to the minimum voltage level 126, as a result of cross-coupling, the CPU 110 may fail to recognize the pulse 122-2 as a valid rising signal transition from zero to one.

In modern gunning transistor logic (GTL) buffer design, the buffers normally include an ability to jump start a buffer pad if the chipset, for example chipset 102, fails to generate a valid rising signal transition from zero to one. This ability to jump start the buffer pad is generally provided by a jump start device called a P-kicker device, as known to those in the art. Referring to FIG. 1B, a pulse signal 130 is depicted, which illustrates the pulse signal 122-2 after being kicked by a P-kicker device to generate an intended overshoot level 132. Unfortunately, the CPU 110 may be an advanced process, such as a 0.85 or 0.25 micron process. As a result, the CPU 110 may have a gate oxide device thickness and voltage tolerance level, which is less than the intended overshoot level 132. The CPU 110 gate oxide device tolerance provides a limit to the overshoot level generated by a P-kicker device.

For example, referring to the pulse 140 as depicted in FIG. 1B, the intended overshoot level 132 may exceed a CPU accepted overshoot level 142. Consequently, if the P-kicker signal pulse 140 rises to an intended overshoot level 132, in excess of the CPU accepted overshoot 142, the signal pulse 140 will eventually break down the oxide thickness of the CPU gate oxide. This will lead to reliability problems in the CPU device 110, resulting in a gradual break down of the gate oxide and the sudden failure of the CPU device 110. For the reasons described above, the risk of intended overshoot levels 132 in excess of CPU accepted overshoot levels 142 is very likely to occur due to the ongoing demand for reduction of circuit area in VSLI design.

Therefore, there remains a need to overcome one or more of the limitations in the above described existing art.

BRIEF DESCRIPTION OF THE DRAWINGS

The features, aspects, and advantages of the present invention will become more fully apparent from the following Detailed Description and appended claims when taken in conjunction with accompanying drawings in which:

FIG. 1A depicts a computer system illustrating the problem of I/O signal to signal coupling as a result of simultaneous switching output (SSO) switching;

FIG. 1B depicts signal pulses illustrating the failure of the rising signal transition and signal pulse and accepted overshoot levels for correcting this problem;

DETAILED DESCRIPTION OF THE INVENTION

A method and apparatus for a low power, multi-mode GTL interface signaling FSB buffer utilizing midrail buffer pad clamping are described. In the following description, for the purposes of explanation, numerous specific details are set forth in order to provide a thorough understanding of the present invention. It will be apparent, however, to one skilled in the art that the present invention may be practiced without some of these specific details. For example, various signals, layout patterns, memory cell configurations and circuits, and logic circuits may be modified according to the teachings of the present invention. The following description provides examples, and the accompanying drawings show various examples for the purposes of illustration. However, these examples should not be construed in a limiting sense as they are merely intended to provide examples of the present invention rather than to provide an exhaustive list of all possible implementations of the present invention. In other instances, well-known structures and devices are shown in block diagram form in order to avoid obscuring the details of the present invention.

System Architecture

Figure 2:
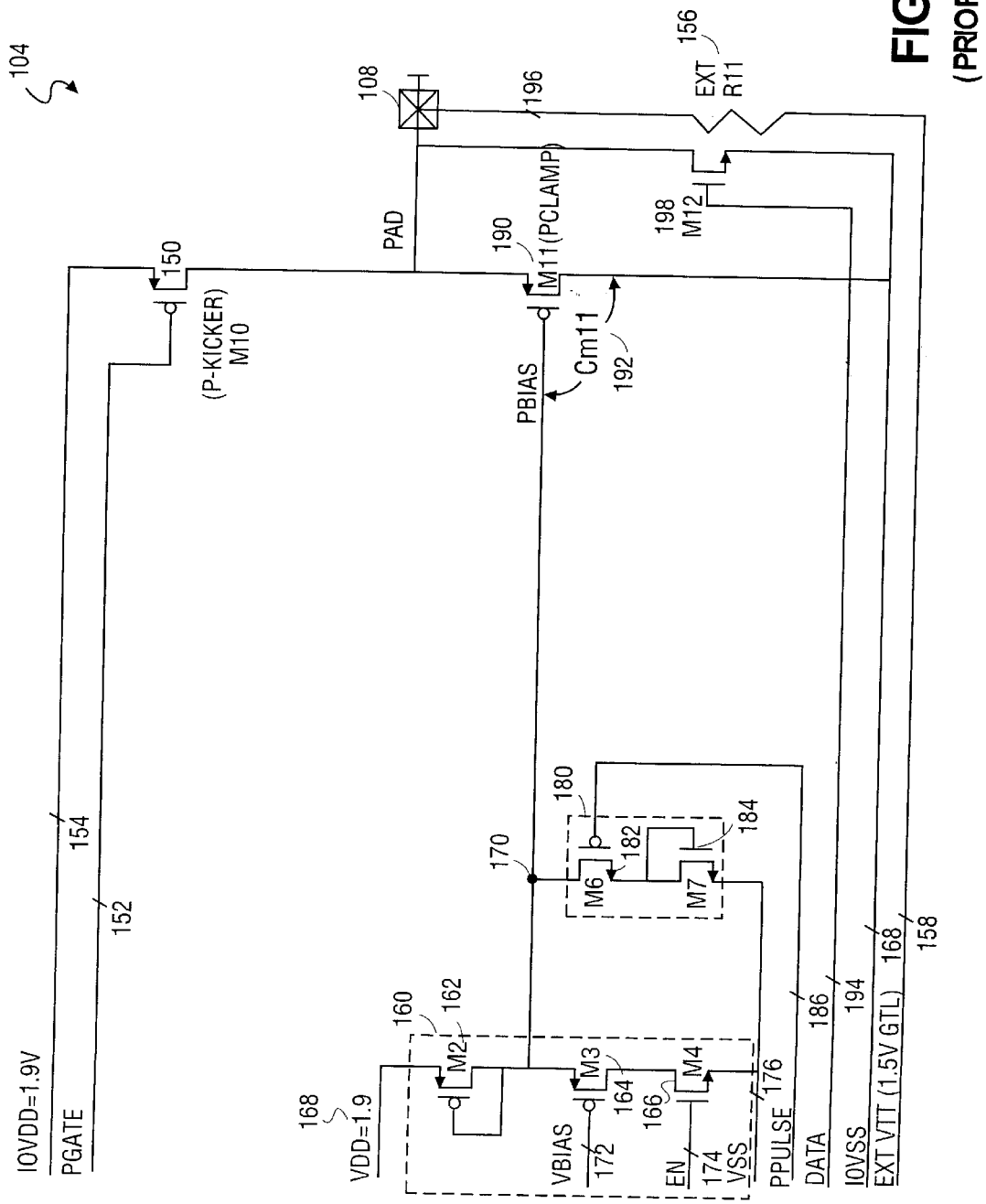
FIG. 2 depicts a conventional buffer including a P-kicker device as known in the art.

Referring now to FIG. 2, the FSB buffer 104, as utilized by the chipset 102 (FIG. 1A), is depicted. The buffer 104 includes an ability to "jump start" the buffer pad 108 if the chipset 102 is found to have trouble generating a rising zero to one signal transition. The buffer 104 utilizes a P-kicker device such as an M10 P-kicker transistor 150. The M10 P-kicker 150 includes a source coupled to a part core power supply VDD (IOVDD) 154, a gate to receive an enable signal (PGATE) 152 and a drain coupled to the buffer pad 108. When enabled by the PGATE signal 152, the M10 P-kicker raises a voltage level of the buffer pad 108 from zero volts to 1.9V and retains the pad voltage level at 1.9V for a one-quarter clock cycle. Following the one-quarter clock cycle, the M10 P-kicker 150 drops the voltage level of the buffer pad 108 to a termination voltage level (Vtt) for another quarter cycle where Vtt is the buffer 104 pull-up power supply 158 (EXT VTT). Following a one-half clock cycle, the voltage level of the buffer pad 108 returns to zero volts for another half clock cycle.

The buffer 104 further includes a static bias circuit 160 as well as the dynamic bias circuit 180 in order to manipulate a node voltage of a bias (PBIAS) node 170. The static bias circuit 160 maintains a node voltage of the PBIAS node 170 at 1.45V (static voltage level) when the termination voltage Vtt equals 1.5V. The dynamic bias circuit 180 drops the node voltage level of the PBIAS node 170 to about 0.8V (dynamic voltage level) in response to a pulse (PPULSE) signal 186. Dropping the PBIAS node 108 voltage level from the static voltage level to the dynamic voltage level turns on a P-clamp transistor (M11 P-clamp) 190. Once turned on the M11 P-clamp 190 conducts to generate a clamping current 196 from the buffer pad 108 through an external resistor 156 and to the external termination voltage supply 158 EXT VTT. This clamping current 196 clamps the voltage level of the buffer pad 108 to Vtt when the buffer pad 108 voltage level overshoots Vtt.

The PPULSE signal 186 is generated in response to the detection in the rising signal transition from zero to one at the buffer pad 104, which we will refer to as dynamic mode. The duration of the PPULSE signal 186 is, for example, less than 1.5 ns. As soon as the PPULSE signal 186 is over, the dynamic bias circuit 180 is turned off and the node voltage of the PBIAS node 170 is returned to the static voltage level by the static bias circuit 160. Once the PBIAS node voltage returns to the static voltage level of 1.45V, the M11 p-clamp 190 is turned off. Consequently, the dynamic bias circuit 180 is active during dynamic mode for less than 1.5 ns, the duration of the PPULSE signal 186.

However, to meet VLSI circuit design demand for faster speed and higher density, the CMOS (complimentary metal-oxide semiconductor) scaling rule, as known in the art, continually results in the decreasing of the thickness of the CMOS gate oxide. As the thickness of the CMOS gate oxide decreases, circuits run the risk of high voltage gate oxidation breakdown. To ease high voltage gate oxidation breakdown, the trend of gunning transistor logic (GTL) is toward low voltage GTL signaling of 1.2V (LVGTL) from the 1.5V GTL interface signaling.

Figure 3:
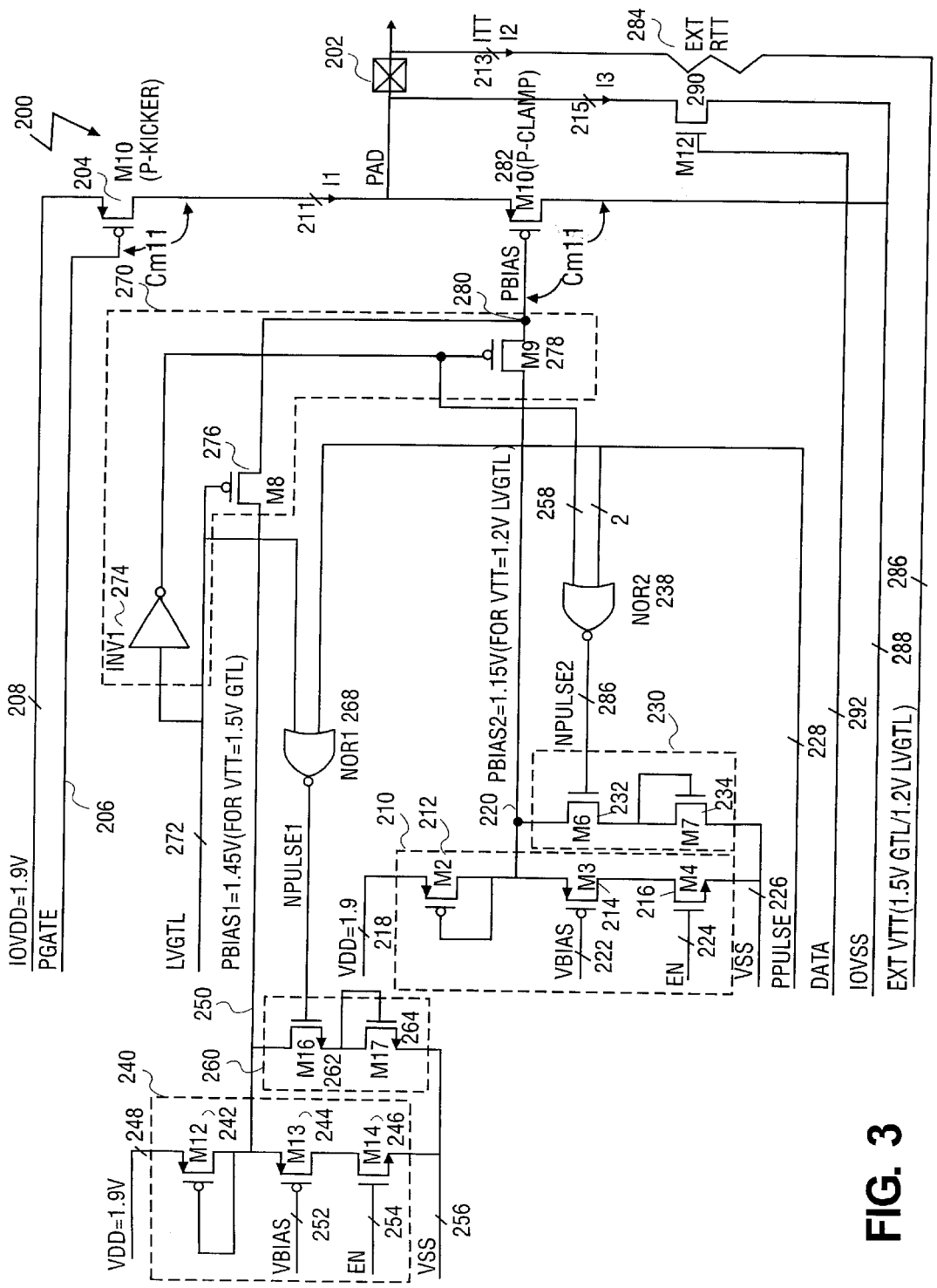
FIG. 3 depicts a multi-level GTL buffer, including a P-kicker device in accordance with an embodiment of the present invention.

Referring now to FIG. 3, a dual mode FSB buffer 200 is depicted in accordance with an embodiment of the present invention. The buffer 200 is designed to accommodate LVGTL interface signals of 1.2V as well as the normal GTL interface signal voltages of 1.5V. As described with reference to FIG. 2, the buffer 200 utilizes a P-kicker transistor (M10 P-kicker) 204 to raise the voltage level from 0V to a part core power supply voltage (IOVDD) 208 of 1.9V. Unfortunately, with the trend toward LVGTL interface signals having a termination voltage Vtt of 1.2V, pad voltage levels in excess of 1.2V can create liability problems. This is due to the fact that a CPU LVGTL buffer (not shown) is a low voltage and thin oxide device. For example, assuming a maximum gate voltage (Vgatemax), then it is desirable to have Vgatemax less than or equal to 1.35V when receiving LVGTL interface signals with a Vtt voltage level of 1.2V.

Referring again to FIG. 3, when the M10 P-kicker 204 is turned on by a signal (PGATE) 206 and powered from IOVDD 208, the M10 P-kicker pulls up the voltage level of the buffer pad 202 from 0V to 1.9V. In addition, if the input signal data 292 is going from a rising signal transition of zero to one, an M12 transistor 290 is turned off. However, with the termination voltage Vtt of 1.2V in LVGTL mode, the voltage level of the buffer pad 202 is pulled down toward the Vtt voltage level of 1.2V through an external transistor Rtt 284. The interaction of IOVDD 208 (1.9V) through the M10 P-kicker device and the termination voltage Vtt (1.2V) through a resistor Rtt 284 brings the voltage level of the buffer pad 202 to a voltage level between IOVDD and Vtt. Since the "on resistance" of the M10 P-kicker (CM11) 209 is much less than Rtt, the voltage level of the buffer pad 202 tends to be closer to IOVDD rather than Vtt. Generally, the voltage level of the buffer pad 202 tends to be pulled up to 1.65 volts by the M10 p-kicker device 204 (intended overshoot level). Clearly, the intended overshoot level of 1.65V is greater than the maximum gate voltage Vgatemax of 1.35V. As a result, the intended overshoot level of 1.65V will eventually destroy a CPU LVGTL input buffer circuit.

The FSB buffer 200 includes an input selection gate 270 which enables the chipset FSB buffer 200 to work with dual GTL interface signals. The buffer supports termination voltages of 1.5V Vtt (GTL mode) and 1.2V Vtt (LVGTL mode). This particular Vtt level is selected by a control (LVGTL) signal 272 which is fed to a 2:1 input selection device 270. The input selection gate 270 routes either a first p-bias (PBIAS1) node (1.45V) or a second p-bias (PBIAS2) node (1.15V) to the input selection gate output node (PBIAS) 280. The input selection device 270 includes, for example, a first inverter 274 that receives the LVGTL signal 272. The input selection device 270 further includes a first pass (M8) transistor 276 having a source coupled to PBIAS1 node 250, a gate to receive LVGTL signal 272 and a drain coupled to the PBIAS node 280. A second pass (M9) transistor 278 includes a gate coupled to the LVGTL signal 272, a source coupled to the PBIAS2 node 220 and a drain coupled to the PBIAS node 280.

For example, in LVGTL mode, the LVGTL signal 372 is equal to one, so the M9 pass transistor 278 is turned on and the M8 pass transistor 276 is off. As a result, the PBIAS2 node 220 functions as the PBIAS node 280 in order to implement LVGTL interface signaling. In GTL mode, the LVGTL signal is equal to zero so the M8 pass transistor 276 is on and the M9 pass transistor 278 is off. Consequently, the PBIAS1 node 250 functions as the PBIAS node 280 with a static voltage level of 1.45V in order to implement GTL interface signaling. Unfortunately, for the reasons described above, when the termination voltage Vtt drops from 1.5V to 1.2V in LVGTL mode, the voltage level of the buffer pad 202 tends to be pulled up to the overshoot voltage level of 1.65V. Since this intended overshoot level of 1.65V exceeds the maximum gate voltage Vgatemax of 1.35V, interface signals transmitted between the chipset FSB buffer 200 and a CPU LVGTL input buffer circuit (not shown) will eventually destroy the gate oxide of the CPU LVGTL input buffer circuit.

To see this qualitatively, assume the resistance of the M10 P-clamp 204 is R1 with a current I1 209. The External resistor 284 has a resistance Rtt with a current Itt 213 and the M11 p-clamp is initially in a clamping state so it is nearly off and includes a large resistance R3 with a negligible current I3 215. Likewise, the transistor M12 290 is always off for pad 0:1 transitions. Consequently, there are three currents at the buffer pad 202 which satisfy the following equation:

$$I1 = Itt + I3 \quad (1)$$

Or $$Itt = I1 - I1 \quad (2)$$

Because $$I3 = 0 \text{ (M11 P-clamp in clamp state)} \quad (3)$$

Therefore, $$Itt = I1 \quad (4)$$

In other words, current from the M10 P-kicker 201 more or less entirely flows into the EXT VTT 286 through the Ext Rtt resistor 284. The M10 P-kicker is operated in linear region after the PGATE signal equals zero. The Itt current, which flows through the resistor Ext Rtt, can be derived in terms of VDD and Vtt based on equation (4) above, as follows:

$$Itt = I1 = \frac{(VDD - Vtt)}{R1 + Rtt} \quad (5)$$

Consequently, the buffer pad 202 voltage level (Vpad) is:

$$Vpad = Vtt + Itt \times Rtt \quad (6)$$

In equation (5) above, Vtt is constant and Rtt is an external resistor 284 with relatively active and constant resistance. Therefore, Vpad is a linearly increasing function of Itt. Since all of the current generated by the M10 P-kicker device is flowing into a EXT VTT 286, the current Itt is the maximum current that can be derived from IO VDD 208. Consequently, Vpad is relatively high and given by the following equation:

$$Vpad = 1.65V > Vgatemax = 1.35V \quad (7)$$

Referring again to FIG. 3, the transistors M2 212, M3 214 and M4 216 form a static bias circuit 210 as described above with reference to FIG. 2. This static bias circuit 210 is used to maintain the PBIAS2 node 220 at a static voltage level of 1.15V. During LVGTL mode (LVGTL=1), the M9 pass transistor 278 is on and the M8 pass transistor 276 is off. During this mode, the voltage level of the PBIAS2 node 220 is dropped to a dynamic voltage level of 0.7V for less than 1 ns by the dynamic bias circuit 220. However, the M10 P-kicker device 204 is on for at least half a cycle (assuming a clock frequency of 133 mhz and a cycle time of 7.5 ns). As a result, the gate of the M11 P-clamp is not biased low enough or long enough by the dynamic bias circuit 220 to clamp the pad voltage level of the buffer pad 202 to a voltage level that is less than Vgatemax.

Figure 4:
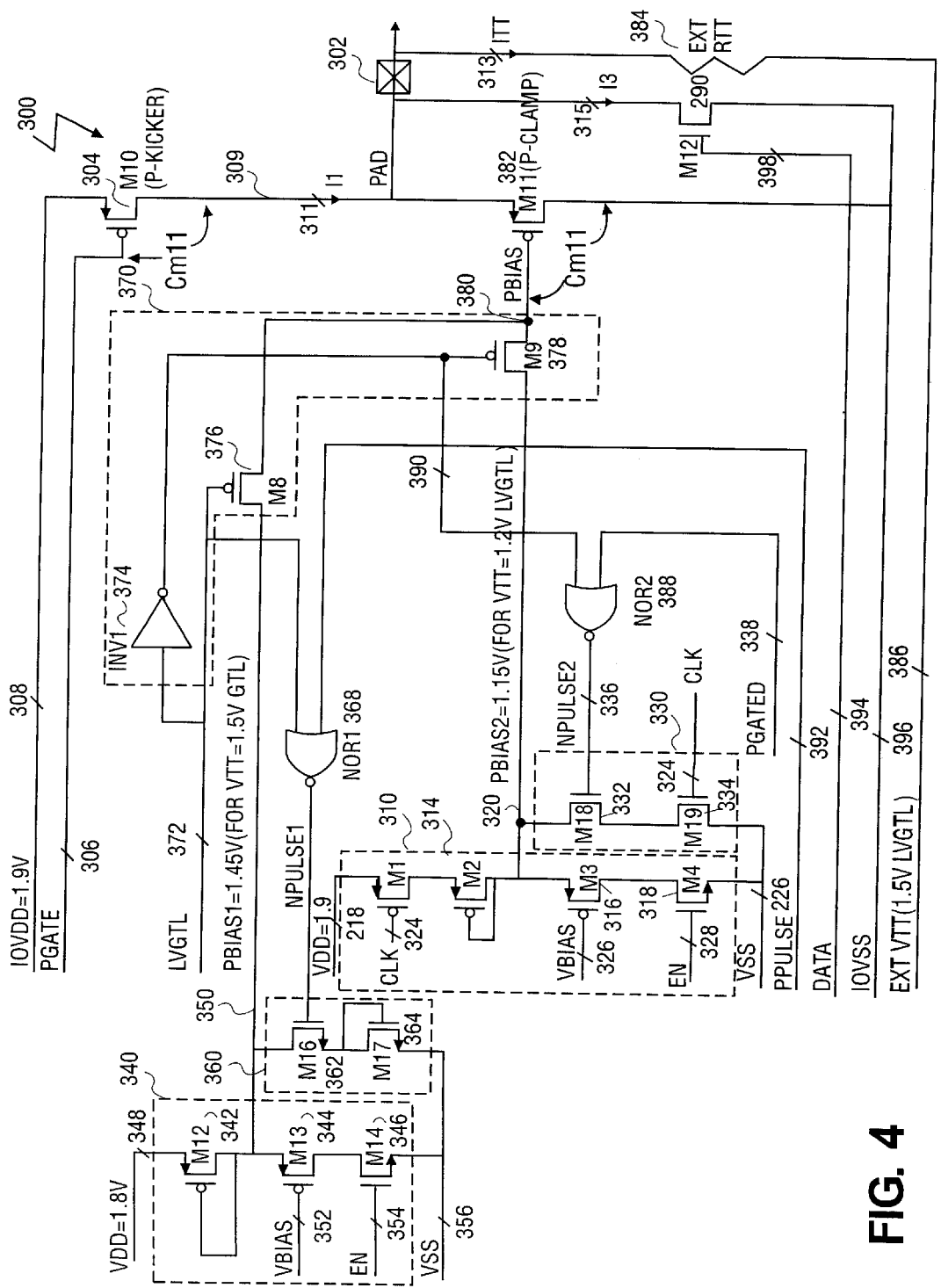
FIG. 4 depicts a multi-level GTL buffer utilizing midrail clamping according to a further embodiment of the present invention.

Referring now to FIG. 4, a dual mode GTL interface signaling FSB buffer 300 for clamping a voltage level at a buffer pad 302 to a midrail voltage which is less than or equal to Vgatemax. The FSB buffer 300 is essentially as described with reference to the FSB buffer 200 (FIG. 43). The buffer 300 includes an M10 P-kicker device 304, an M11 P-clamp 382 with an external resistor (Ext Rtt) 384 coupled between the buffer pad 302 and an external termination voltage (EXT VTT) 386. The FSB buffer 300 includes an input selection gate 370 which enables dual mode GTL interface signaling as described above. Based on an input (LVGTL) signal 372 either a first p-bias (PBIAS1) node 350 or a second p-bias (PBIAS2) node 320 is routed and functions as the PBIAS node 380 of the FSB buffer 300.

The PBIAS1 node 350 implements GTL mode with a termination voltage Vtt equal to 1.5V. A first static bias circuit 340 and a first dynamic bias circuit 360, as described above, are coupled to the PBIAS1 node 350. The PBIAS2 node 320 is used to implement LVGTL mode and LVGTL interface, signaling with a termination voltage Vtt equal to 1.2V. However, in order to implement midrail clamping of the voltage level at the buffer pad 302, below the Vgatemax voltage level, a static bias circuit 310 is modified from the description provided with reference to the FSB buffer 200 as depicted in FIG. 3. In addition a dynamic saturation bias circuit 330 is added to the FSB buffer 300 in order to bias the M11 P-clamp 382 at a saturation level for a sufficient period of time to clamp the pad voltage level to a midrail voltage level that is less than Vgatemax.

Based on equation (5) as described above, if the Itt current 313 flowing through the Rtt resistor 384 can be reduced, then the Vpad voltage level will be lowered further. In order to force the pad voltage level Vpad to drop below Vgatemax, the M11 P-clamp 382 needs to discharge a larger amount and for a longer period of time. In other words, by increasing the I3 current 315 in equation (2) above, the Itt current 313 and Vpad from equation (5) are also decreased. This goal is accomplished by biasing the M11 P-clamp 384 into a saturation mode with the desired I3 current 315. During this mode, the M11 P-clamp 382 functions as a current sink and generates a constant current I3 315. Consequently, during the M10 P-kicker active period, which is approximately half a cycle, the key to reducing the Vpad voltage level is to bias the gate of the M11 P-clamp 382 to a lower voltage level. The I3 current generated by the M11 P-clamp 382 is given by the following equation:

$$I3 = K(Vgs - |Vtp|)^2 \quad (8)$$

where K is the K factor related, for example, to Intel P856.6 process, device size and universal constraints.

By biasing the PBIAS node 380 to a voltage level of 0.45V, down from a static voltage level of 1.1V, a voltage between the gate and the source Vgs of the M11 P-clamp 382 is increased to a high enough level. As a result the I3 is also increased to reach a desired increased level. As a result, the Itt current 313 is reduced and Vpad is lowered to a midrail overshoot voltage of 1.35V. As a result, equation (6) is changed to:

$$Vpad = 1.35V = Vgatemax = 1.35V \quad (9)$$

In order to reduce the PBIAS node 380 to the saturation voltage level of 0.45V, and to maintain Vpad at the midrail voltage level for the entire period of time in which the M10 P-kicker device 304 is active, the dynamic saturation bias circuit 330 is added to the FSB buffer 300. In addition, the static bias circuit 310 is modified to include an M1 transistor 312. The M1 transistor 312 includes a source coupled to a part core power supply (VDD) 322, a gate which receives a clock (CLK) signal 324 and a drain which functions as a source to an M2 transistor 314. The M2 transistor 314 is connected in diode fashion to the PBIAS2 node 320. Consequently, the M1 transistor 312 functions as a switch for the saturation bias circuit 310, such that the saturation bias circuit maintains the PBIAS2 node 320 at the static voltage level of 1.15V in response to the CLK signal 324.

The dynamic saturation bias circuit includes an M18 transistor 332 having a drain coupled to the PBIAS node 320 and a source which functions as a drain to an M19 transistor 334. The M19 transistor 334 includes a gate coupled to the CLK signal 338 and a source coupled to an internal ground (VSS) 356. The M18 transistor 332 is activated by a delayed PGATE bar signal (PGATEDB) 336 while the M19 transistor is activated by the CLK signal 324.

Referring again to FIG. 4, prior to activation of the M10 P-kicker 304, the PGATE signal 306 and a delayed version of the PGATE signal (PGATED) equal one while the CLK signal 324 equals zero. Consequently, the M1 transistor 312 is active while the dynamic saturation bias circuit 330 is inactive. The activation of the M1 transistor 312 also activates the saturation bias circuit 310, such that the PBIAS2 node voltage 320 is maintained at the static voltage level of 1.15V. Once the p-kicker device 304 is activated by the PGATE signal 306, the CLK signal 312 will equal one while the PGATE signal 306 and the PGATED signal 338 will transition to zero. As a result, the dynamic saturation bias circuit 330 is active with the activation of both the M18 transistor 332 and the M19 transistor 334. Consequently, the PBIAS node 380 is discharged toward ground while the M1 transistor 312, as well as the static bias circuit 310, is deactivated by the CLK signal 324. The PBIAS2 node 320 is discharged by the M18 transistor 332 and the M19 transistor 334.

The FSB buffer 300 is functioning in LVGTL mode when LVGTL signal 372 equals zero, as described above. During LVGTL mode, the M9 pass transistor 378 is on so the PBIAS node 380 is also discharging from the static voltage level of 1.15V to the dynamic saturation voltage of 0.45V during this discharging cycle. This dynamic saturation voltage level of 0.45V is low enough to force the M11 P-clamp transistor 382 into saturation mode in order to generate the desired I3 current, as described above. In addition, the PBIAS2 node 320 is held at this dynamic saturation voltage level for an entire half cycle by the CLK signal 324 and the PGATEDB signal 338. As a result, pulling down of the PBIAS2 node 320 to the dynamic saturation voltage level is synchronized with the active duration of the M10 P-kicker device 304.

As long as the PBIAS2 node 320 is held at the dynamic saturation voltage level, the M11 P-clamp 382 assists the Rtt resistor 384 in discharging enough current from the I/O buffer pad 302 to pull down the voltage level of the buffer pad 302 in order to generate a midrail voltage level of 1.35V, which is less than Vgatemax. In other words, the M11 p-clamp and EXT VTT 386 pull down the buffer pad 302 voltage level towards VTT, while the M10 P-kicker device 304 pulls up the pad voltage level to IOVDD 308. As such, the combination of these three devices counteract with one another to generate a final midrail voltage level at the buffer pad 302 which is less than Vgatemax. In summary, the gate of the M11 p-clamp 382 is biased into the saturation mode by holding the dynamic saturation voltage level of the PBIAS node 380 to generate a voltage level at the buffer pad 302 which is less than Vgatemax. Since this final voltage level of 1.35V is between the IOVDD level of 1.9V and the termination voltage Vtt of 1.2V, the functionality provided by the FSB buffer 300 is referred to as midrail overshoot clamping.

In a further embodiment of the present invention, the M18 transistor 332, as well as the dynamic saturation bias circuit 330, is turned on with a delay from the PGATE signal 306. This delayed PGATE signal, as described above, is the PGATED signal 338. This signal is further delayed through the NOR-gate (NOR2) 388 and eventually becomes the NPULSEZ (PGATEDB) signal 336, which turns on the M18 transistor 332. Consequently, the M10 P-kicker device 304 is turned on before the dynamic saturation bias circuit 330 is activated by the M18 transistor. This ensures that the M10 P-kicker device 304 is able to pull up the voltage level of the I/O buffer pad in order to ensure a valid rising signal transition at the buffer pad 302. In other words, the buffer pad 302 needs to be kicked toward the IOVDD 308 with the I1 current prior to pull down of the PBIAS node 380 by the M11 p-clamp 382. Once the M11 p-clamp 382 is turned on, the M11 p-clamp 382 establishes a diversion current I3 to midrail clamp the voltage level of the buffer pad 302 from 1.65V to 1.35V. Once the discharging cycle of the M10 p-kicker device 304 is over, the CLK signal 324 will have a falling transition to zero, which turns off the M19 transistor 334 and turns on the M1 transistor 312 as well as the static bias circuit 310. Once turned on, the static bias circuit 310 recharges the PBIAS2 node 320 as well as the PBIAS node 380 to restore the respective voltage levels to the static voltage level of 1.15V.

Figure 5:
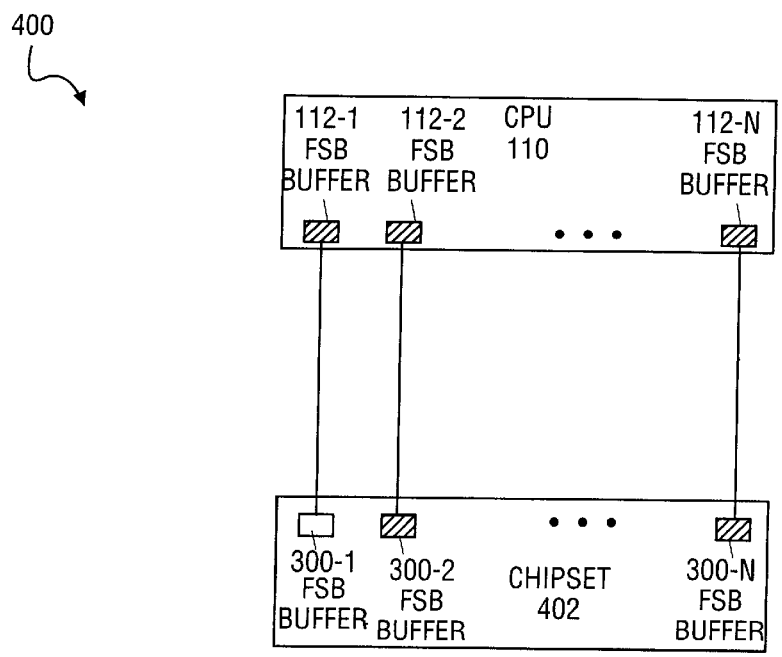
FIG. 5 is a block diagram illustrating a computer system including a chipset utilizing I/O buffers in accordance with the teachings of the present invention.

Referring now to FIG. 5, a block diagram of the computer system 400, including an FSB buffer as taught by the present invention, is depicted. The computer system 400 includes a chipset 402 having a plurality of the FSB buffer 300 (300-1, 300-2, . . . , 300-N) as described with reference to FIG. 4. The FSB buffers 300 are coupled to a front side bus 302 (302-1, 302-2, . . . , 302-N). The computer system 400 further includes the CPU 110, as described with reference to FIG. 2. The CPU 110 includes a plurality of LVGTL FSB buffers 112 (112-1, 112-2, . . . , 112-N) with each FSB buffer 112 coupled to a respective FSB bus 114 (114-1, 114-2, . . . , 114-N). The chipset front side buses 302 communicate with the CPU front side buses 114 via a respective trace 406 (406-1, 406-2, . . . , 406-N). Utilizing teachings of the present invention, the chipset 402 can generate LVGTL interface signals with the midrail voltage overshoot level that is less than a maximum gate voltage Vgatemax accepted by the CPU LVGTL buffers 112. Consequently, the CPU LVGTL buffers 112 do not experience reliability problems or damage to the thin oxide gate device as a result of intended overshoot levels (1.65V) which exceed the maximum gate voltage for the CPU LVGTL buffers 112. The chipset 402 is, for example, a graphics memory controller hub as manufactured by the Intel Corporation.

Figure 6:
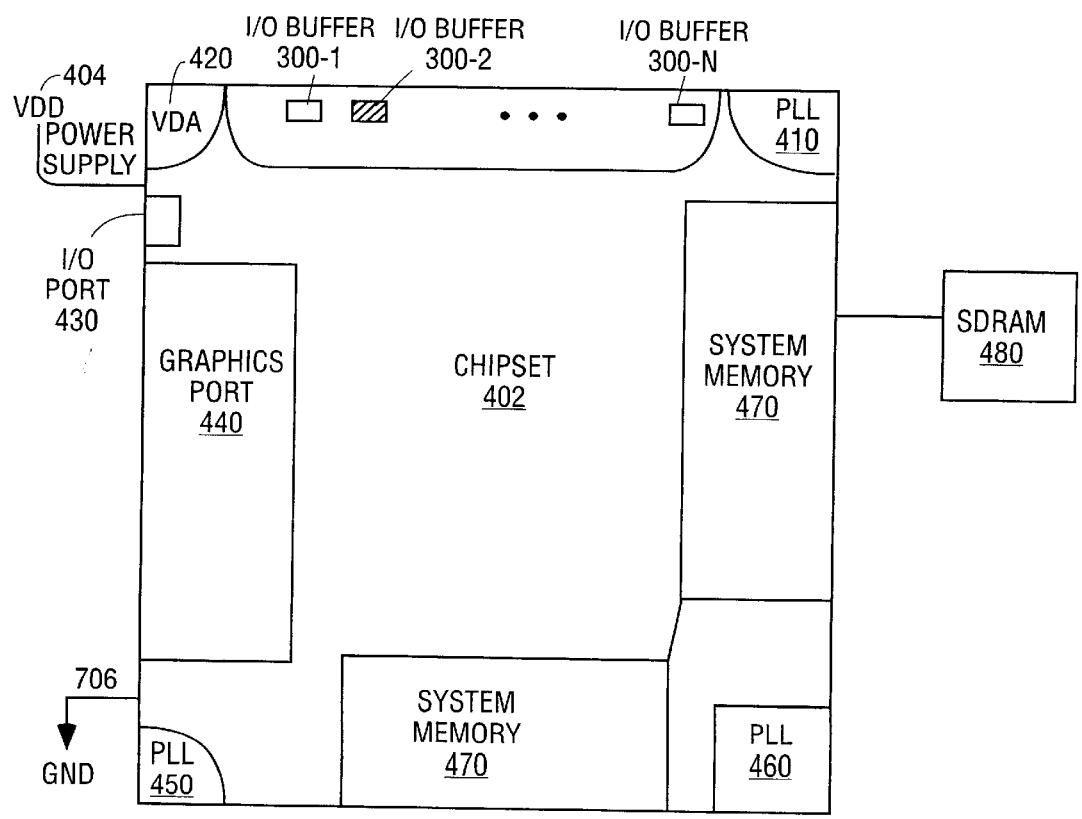
FIG. 6 illustrates a block diagram of an integrated circuit package embodiment of the present invention.

Referring now to FIG. 6, a block diagram of an integrated circuit package embodiment of the present invention utilizing the FSB buffers as depicted in FIG. 4 is illustrated. This chipset 402 may be manufactured to include the front side bus area, including the dual mode FSB buffers 300. The chipset may also be manufactured to include phase locked loops (PLL) 410, 450 and 460. The chipset 402 may also include a VDA 420, an I/O port 430, a graphics port 440 and a system memory 470 to interface with dynamic memory such as SDRAM 480.

Figure 7A:
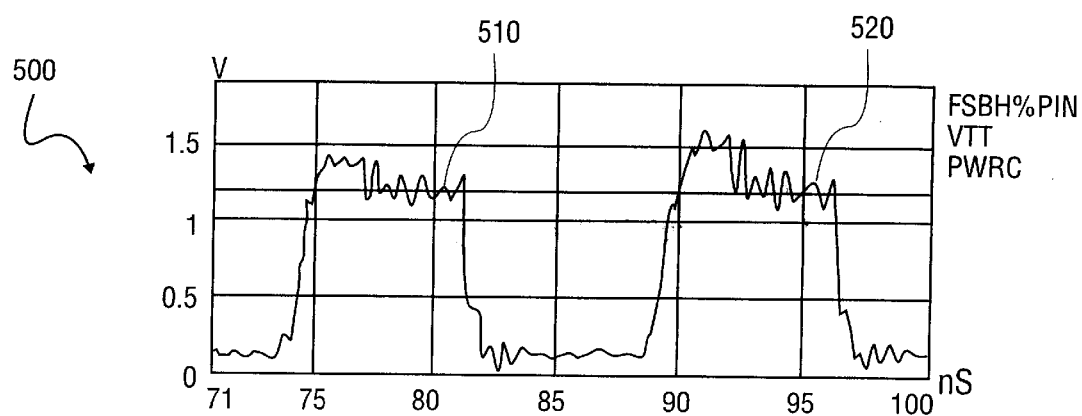
FIGS. 7A, 7B and 7C depict graphs illustrating benefit provided by the teachings of the present invention.
Figure 7B:
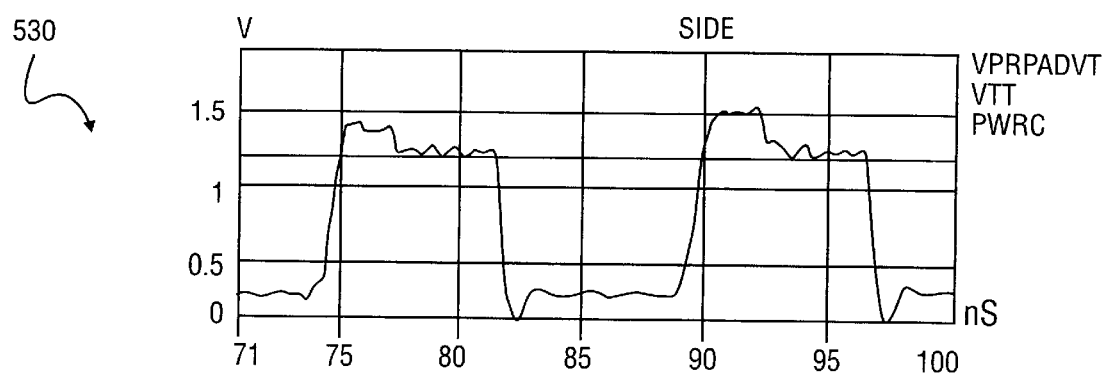
Figure 7C:
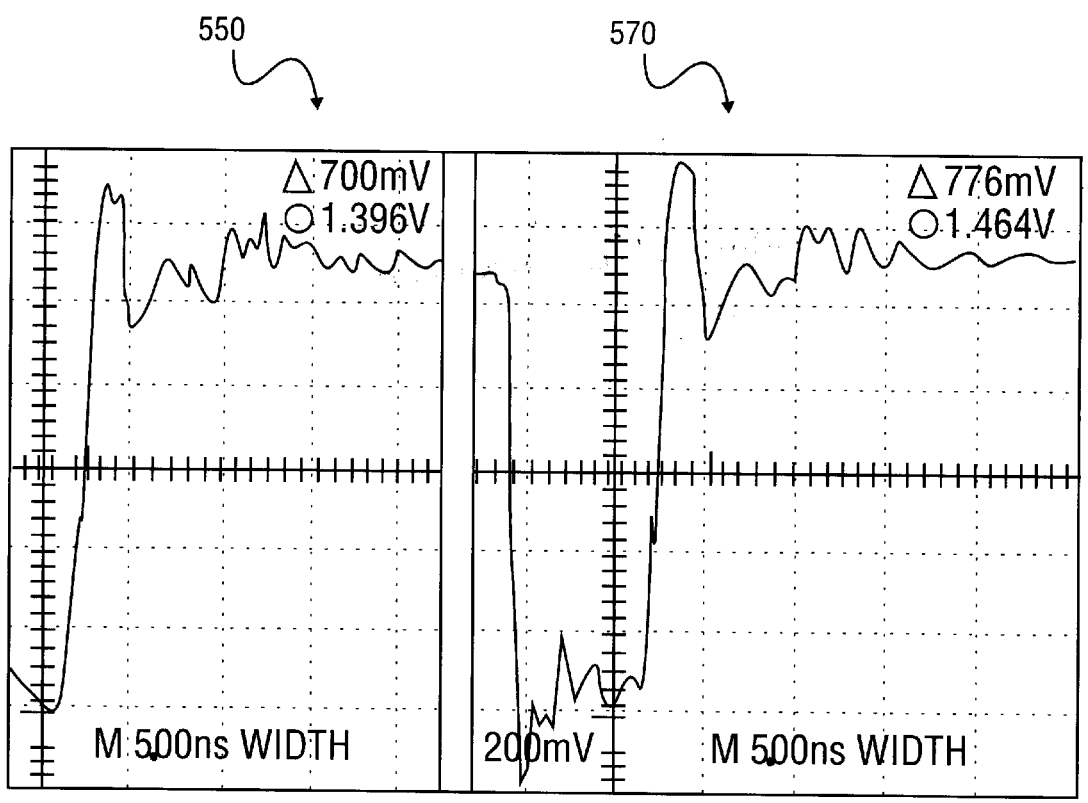

The benefits provided by the present invention may be illustrated with references to FIGS. 7A, 7B and 7C. Referring to FIG. 7A, the graph on the left-hand side 510 illustrates an FSB buffer as taught by the present invention. The graph 510 illustrates a voltage level at the buffer pad which is maintained at approximately 1.35V and then returned to the Vtt voltage level following a one-quarter cycle. On the right-hand side of the graph 620, the voltage level of the pad, using a conventional FSB buffer, is illustrated. The voltage level at the pad reaches an overshoot level of 1.65V, which is in excess of the maximum gate voltage of 1.35V.

Referring to FIG. 7B, the signal as seen by the CPU buffer is illustrated. Again, the signal 635 received by the CPU buffer is illustrated on the left-hand side and is seen to achieve a midrail voltage level of 1.35V, which falls to the Vtt voltage level of 1.2V following a one quarter cycle period. On the right-hand side of FIG. 8B, the signal 540 received by the CPU buffer is seen to exceed a voltage level of 1.5V in excess of the Vgatemax voltage level.

Referring now to FIG. 8C, the voltage level 650 generated by the FSB buffer as taught by the present invention (FIG. 4) reaches a maximum voltage overshoot level of 1.396V and then returns to the midrail voltage level of 1.35V. A duration of this maximum voltage overshoot level is not sufficient to damage a thin oxide gate device, while the 0.45V in excess of the midrail voltage is negligible. In contrast, the voltage level at the buffer pad generated by a conventional buffer reaches a maximum gate voltage of 1.46V in excess of the maximum gate voltage of 1.35V. Signals in excess of the maximum gate voltage will eventually break down the gate oxide of LVGTL CPU buffers, which can lead to reliability problems and eventual failure of the CPU device.

It is to be understood that even though numerous characteristics and advantages of various embodiments of the present invention have been set forth in the foregoing description, together with details of the structure and function of various embodiment of the invention, this disclosure is illustrative only. Changes may be made in detail, especially matters of structure and management of parts within the principles of the present invention to the full extent indicated by the broad general meaning of the terms in which the appended claims are expressed. For example, the particular element may vary depending on the particular application for the novel mixed storage format while maintaining substantially the same functionality without departing from the scope and spirit of the present invention.

In addition, although embodiments described herein are directed to a dual GTL interface signaling FSB buffer, it will be appreciated by those skilled in the art that the teaching of the present invention can be applied to other systems. In fact, I/O systems which communicate with thin oxide gate device are within the teachings of the present invention, without departing from the scope and spirit of the present invention.

Having disclosed exemplary embodiments and the best mode, modifications and variations may be made to the disclosed embodiments while remaining within the scope of the invention as defined by the following claims.

What is claimed is:

1. A method comprising:
   detecting a rising signal transition at an I/O buffer pad of an I/O buffer;
   pulling up a voltage level at the I/O buffer pad to an intended overshoot voltage level using a P-kicker device and;
   pulling down the voltage level at the I/O buffer pad to a termination voltage level Vtt using a pull-down device,
   wherein the pulling up of the voltage level at the I/O buffer pad to the intended overshoot voltage level and the pulling down of the voltage level at the I/O buffer pad to the termination voltage level Vtt counteract to produce a low voltage midrail overshoot level less than or equal to a maximum gate voltage level and greater than the termination voltage level Vtt in order to prevent gate oxide breakdown caused by overshoot voltage levels in excess of the maximum gate voltage level.

2. The method of claim 1, further comprising:
   receiving a mode signal indicating a selected termination voltage level Vtt of a pbias node; and
   supplying the selected Vtt voltage level to the pbias node, such that multiple gunning transistor logic interface signaling is supported by the I/O buffer.

3. The method of claim 1, wherein the pulling up of the voltage level at the I/O buffer pad to the intended overshoot voltage level further comprises:
   activating a pull-up transistor in response to a pgate signal, to pull-up the voltage level at the I/O buffer to the intended overshoot voltage level; and
   de-activating the pull up transistor in response to de-activation of the pgate signal.

4. The method of claim 1, wherein the detecting the rising signal transition further comprises:
   generating a pgate signal indicating a rising signal transition at the I/O buffer pad having a voltage level less than a minimum transition voltage level; and
   de-asserting the pgate signal following a predetermined period of time.

5. The method of claim 1, wherein the pulling-down of the voltage level at the I/O buffer pad further comprises:
   activating a dynamic saturation bias circuit, in response to a delayed pgate signal, to pull down a pbias node voltage from a static voltage level to a dynamic saturation voltage level, thereby clamping the voltage level at the I/O buffer pad to the Vtt voltage level; and
   de-activating the dynamic saturation circuit in response to de-activation of the delayed pgate signal.

6. The method of claim 5, wherein activating the dynamic saturation bias circuit in response to the delayed pgate signal further comprises:
   causing a p-clamp transistor to conduct and generate a clamping current from the I/O buffer pad through an external resistor to an external supply voltage, such that the clamping current counteracts the pulling-up of the voltage level at the I/O buffer pad to achieve the low voltage midrail overshoot voltage level at the I/O buffer pad,
   wherein the p-clamp transistor is de-activated once the pbias node voltage is restored to the static voltage level.

7. The method of claim 6, further comprising:
   generating a pgate signal indicating a rising signal transition at the I/O buffer pad having a voltage level less than a minimum transition voltage level; and
   de-asserting the pgate signal following a predetermined period of time.

8. The method of claim 1, further comprising:
   detecting that the rising signal transition is complete in response to a pgate signal indicating a rising signal transition at the I/O buffer pad;
   de-activating the p-kicker device to return the I/O buffer pad voltage level to the Vtt level;
   de-activating a dynamic circuit saturation bias in order to begin restoration of a pbias node voltage from a dynamic saturation voltage level to the static voltage level; and
   activating a static bias circuit to pull-up the pbias node voltage from the dynamic voltage level to the static voltage level.

9. An apparatus, comprising:
   a buffer having
      a p-kicker pull-up device to pull up a voltage level at a buffer pad to an intended overshoot voltage level;
      a pull-down device to pull down the voltage level at the buffer pad to a termination voltage level Vtt;

wherein the pull up of the voltage level at the buffer pad to the intended overshoot voltage level and the pull down of the voltage level at the buffer pad to the termination voltage level Vtt counteract to produce a midrail overshoot voltage level less than or equal to a maximum gate voltage level and greater than the termination voltage level Vtt in order to prevent gate oxide breakdown caused by overshoot voltage levels in excess of the maximum gate voltage level.

10. The apparatus of claim 9, further comprising:
a mode selection unit to receive a mode signal indicating a selected static voltage level of the pbias node, and to supply the selected static voltage level to the pbias node, such that multiple gunning transistor logic signaling is supported by the buffer.

11. The apparatus of claim 10, wherein the mode selection unit comprises:
a first mode transistor having a source coupled to a first static voltage level, a drain coupled to the pbias node, and a gate coupled to the mode signal;
a second mode transistor having a source coupled to a second static voltage level, a drain coupled to the pbias node, and a gate coupled to an inverted mode signal,
wherein when the mode signal activates the first mode transistor, the first static node voltage is provided to a gate of a p-clamp transistor for clamping the buffer pad based on the first static voltage level, and when the inverted mode signal activates second mode transistor, the second static node voltage is provided to the gate of p-clamp transistor for clamping the buffer pad based on the second static voltage level.

12. The apparatus of claim 9, further comprising:
a static bias circuit having:
a first static transistor having a source coupled to a part core power supply Vdd and a gate coupled to a clock signal;
a second static transistor having a source coupled to a drain of the first static transistor and a gate and a drain coupled to a pbias node in a diode configuration;
a third static transistor having a source coupled to the pbias node and a gate coupled to a bias voltage to bias the third static transistor in a saturation region to maintain a constant current through the first and second static transistors; and
a fourth static transistor having a source coupled to a drain of the third static transistor, a drain coupled to an internal ground and a gate coupled to a buffer enable signal, such that the fourth static transistor functions a switch for enabling the static bias circuit to maintain the pbias node at the static voltage level.

13. The apparatus of claim 9, wherein the p-kicker pull up device comprises:
a pull-up transistor having a source coupled to a part core power supply Vdd, a gate coupled to a pgate signal and a drain coupled to the buffer pad;
wherein the pull-up transistor is activated in response to a pgate signal, to pull-up the voltage level at the buffer to the intended overshoot voltage level, and de-activated by the de-activation of the pgate signal, such that the voltage level of the buffer pad returns to the termination voltage level Vtt.

14. The apparatus of claim 9, further comprising:
a dynamic saturation bias circuit to activate the pull-down device in response to a pgatedb signal and a clock signal, such that the pull-down device pulls down pulls down the voltage level of the buffer pad to the termination voltage level Vtt to counteract pull-up of the buffer pad voltage by the p-kicker pull-up device to achieve the midrail overshoot voltage level.

15. The apparatus of claim 14, wherein the dynamic saturation bias circuit further comprises:
a first dynamic transistor having a drain coupled to the pbias node and a gate coupled to the pgatedb signal to activate the first dynamic transistor as a switch; and
a second dynamic transistor having a drain coupled to a source of the first dynamic transistor, a gate coupled to the clock signal, and a source coupled to the-an internal ground, such that when the first dynamic transistor is activated by the pgatedb signal and the second dynamic transistor is activated by the clock signal, the pbias node voltage is discharged through the first and second dynamic transistors and drops from a static voltage level to a saturation voltage level to activate the pull-down device.

16. The apparatus of claim 15, wherein the dynamic saturation bias circuit further comprises:
a gate delay circuit having
a first logic unit to receive a buffered version of the pgate signal pgated as a first input and an inverted version of a mode signal as a second input and generate a logical NOR operation of the first and second inputs to generate the pgatedb signal,
wherein the p-kicker device begins pulling-up the buffer pad voltage level in response to the pgate signal prior to pulling-down of the buffer pad voltage level by the pull-down device in response to the p-bias node voltage controlled by the dynamic saturation bias circuit.

17. The apparatus of claim 9, further comprising:
an external resistor coupled between an external power supply and the buffer pad;
a data transistor having a source coupled to the buffer pad, a drain coupled to a buffer ground, and a gate coupled to a data signal; and
a p-clamp transistor having a gate coupled to the pbias node, a drain coupled to an external ground, and a source coupled to the buffer pad, such that when the pbias node voltage level drops to dynamic saturation voltage level, the p-clamp transistor begins conducting and generates a clamping current from the buffer pad through an external resistor, such that the clamping current counteracts the pull-up of the voltage level at the buffer pad by the pull-up device to achieve the midrail overshoot voltage level at the buffer pad,
wherein the p-clamp transistor is de-activated once the pbias node voltage is restored to the static voltage level, returning the buffer pad voltage level to the termination voltage level Vtt.

18. The apparatus of claim 9, further comprising:
very large scale integration (VLSI) logic built on a same die as the buffer and coupled to generate and feed the pgate signal pgated signal, an enable signal and a data signal.

19. The apparatus of claim 18, further comprising:
an integrated circuit package containing the die in which the VLSI logic, the buffer, and the buffer pad are built, the buffer pad coupled to an external terminal voltage supply via an external resistor of the package.

20. A system comprising:
a front side bus coupling a processor to chipset via a chipset front side bus;
a plurality of front side bus buffers including:
a p-kicker pull-up device to pull up a voltage level at a buffer pad to an intended overshoot voltage level;
a pull-down device to pull down the voltage level at the buffer pad to a termination voltage level Vtt wherein the pull up of the voltage level at the buffer pad to the intended overshoot voltage level and the pull down of the voltage level at the buffer pad to the termination voltage level Vtt counteract to produce a midrail overshoot level less than or equal to a maximum gate voltage level and greater than the termination voltage Vtt in order to prevent gate oxide breakdown caused by overshoot voltage levels in excess of the maximum gate voltage level.

21. The system of claim 20, further comprising:
a mode selection unit to receive a mode signal indicating a selected static voltage level of a pbias node, and supply the selected static voltage level to the pbias node, such that multiple gunning transistor logic interface signaling is supported by the buffer.

22. The system of claim 21, wherein the mode selection unit comprises:
a first mode transistor having a source coupled to a first static voltage level, a drain coupled to the pbias node, and a gate coupled to the mode signal;
a second mode transistor having a source coupled to a second static voltage level, a drain coupled to the pbias node, and a gate coupled to an inverted version of the mode signal,
wherein when the mode signal activates the first mode transistor and de-activates the second mode transistor, the first static node voltage is provided to a gate of a p-clamp transistor for clamping the buffer pad based on the first static voltage level, and when the mode signal activates a second mode transistor and de-activates the first mode transistor, the second static node voltage is provided to the gate of the p-clamp transistor for clamping the buffer pad based on the second static voltage level.

23. The system of claim 20, further comprising:
a static bias circuit having:
a first static transistor having a source coupled to a part core power supply Vdd and a gate coupled to a clock signal;
a second static transistor having a source coupled to a drain of the first static transistor and a gate and a drain coupled to the pbias node in a diode configuration;
a third static transistor having a source coupled to a pbias node and a gate coupled to a bias voltage to bias the third static transistor in a saturation region to maintain a constant current through the first and second static transistors; and
a fourth static transistor having a source coupled to a drain of the third static transistor, a drain coupled to the internal ground and a gate coupled to a buffer enable signal, such that the fourth static transistor functions as a switch for enabling the static bias circuit to maintain the pbias node at the static voltage level.

24. The system of claim 20, wherein the p-kicker pull-up device comprises:
a pull-up transistor having a source coupled to a part core power supply Vdd, a gate coupled to a pgate signal and a drain coupled to the buffer pad;
wherein the pull-up transistor is activated in response to the pgate signal, to pull-up the voltage level at the buffer pad to the intended overshoot voltage level, and de-activated by the de-activation of the pgate signal, such that the voltage level of the buffer pad returns to the termination voltage level Vtt.

25. The system of claim 20, further comprising:
a dynamic saturation bias circuit to activate the pull-down device in response to a pgatedb signal and a clock signal, such that the pull-down device pulls-down the voltage level of the buffer pad to the termination voltage level Vtt to counteract pull-up of the buffer pad voltage by the p-kicker device to achieve the midrail overshoot level.

26. The system of claim 25, wherein the dynamic saturation bias circuit further comprises:
a first dynamic transistor having a drain coupled to the pbias node and a gate coupled to the pgatedb signal to activate the first dynamic transistor as a switch; and
a second dynamic transistor having a drain coupled to a source of the first dynamic transistor, a gate coupled to the clock signal, and a source coupled to an internal ground, such that when the first dynamic transistor is activated by the pgatedb signal and the second dynamic transistor is activated by the clock signal, the pbias node voltage is discharged through the first and second dynamic transistors and drops from a static voltage level to a saturation voltage level to activate the pull-down device.

27. The system of claim 26, wherein the dynamic saturation bias circuit further comprises:
a gate delay circuit having
a first logic unit to receive a buffered version of the pgate signal pgated as a first input and an inverted version of a mode signal as a second input and generate a logical NOR operation of the first and second inputs to generate the pgatedb signal,
wherein the p-kicker pull-up device begins pulling up the buffer pad voltage level in response to the pgate signal prior to pulling-down of the buffer pad voltage level by the pull-down device in response to the p-bias node voltage controlled by the dynamic saturation bias circuit.

28. The system of claim 20, further comprising:
an external resistor coupled between an external power supply and the buffer pad;
a data transistor having a source couple to the buffer pad, a drain coupled to a buffer ground, and a gate coupled to a data signal; and
a p-clamp transistor having a gate coupled to the pbias node, a drain coupled to an external ground, and a source coupled to the buffer pad, such that when the pbias node voltage level drops to the dynamic saturation voltage level, the p-clamp transistor begins conducting and generates a clamping current from the buffer pad through an external resistor, such that the clamping current counteracts the pull-up of the voltage level at the buffer pad by the pull-up device to achieve the midrail overshoot level at the buffer pad,
wherein the p-clamp transistor is de-activated once the pbias node voltage is restored to the static voltage level, returning the buffer pad voltage level to the termination voltage level Vtt.

29. The system of claim 20, further comprising:
very large scale integration (VLSI) logic built on a same die as the buffer and coupled to generate and feed a p-pulse signal, an enable signal and a data signal.

30. The system of claim 29, further comprising:
an integrated circuit package containing the die in which the VLSI logic, the buffer, and the buffer pad are built, the buffer pad coupled to an external terminal voltage supply via an external resistor of the integrated circuit package.

* * * * *

UNITED STATES PATENT AND TRADEMARK OFFICE
CERTIFICATE OF CORRECTION

PATENT NO. : 6,617,880 B2
DATED : September 9, 2003
INVENTOR(S) : Yuan

It is certified that error appears in the above-identified patent and that said Letters Patent is hereby corrected as shown below:

Column 11,
Line 65, after "pull-down device", delete "pulls down".

Column 12,
Line 9, before "an internal", delete "the-".

Signed and Sealed this

Twentieth Day of January, 2004

JON W. DUDAS
*Acting Director of the United States Patent and Trademark Office*